US012666684B2

(12) United States Patent
Luo et al.

(10) Patent No.: US 12,666,684 B2
(45) Date of Patent: Jun. 23, 2026

(54) SEMICONDUCTOR DEVICE AND METHOD OF FABRICATING THE SAME

(71) Applicant: Fujian Jinhua Integrated Circuit Co., Ltd., Quanzhou City (CN)

(72) Inventors: Chi-Ren Luo, Quanzhou City (CN); Yifei Yan, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 402 days.

(21) Appl. No.: 18/224,582

(22) Filed: Jul. 21, 2023

(65) Prior Publication Data

US 2024/0405086 A1      Dec. 5, 2024

(30) Foreign Application Priority Data

Jun. 1, 2023   (CN) .......................... 202310643682.7
Jun. 1, 2023   (CN) .......................... 202321381754.7

(51) Int. Cl.
H10D 64/23 (2025.01)
H10D 30/01 (2025.01)
(Continued)

(52) U.S. Cl.
CPC ....... H10D 64/258 (2025.01); H10D 30/0227 (2025.01); H10D 62/115 (2025.01); H10W 20/069 (2026.01)

(58) Field of Classification Search
CPC .......... H10D 30/0212; H10D 30/0227; H10D 64/258; H10D 62/115; H10D 64/01; H10D 64/62; H10D 30/601; H10D 84/0158; H10D 62/834; H10D 62/021;

H10D 84/038; H10D 84/853; H10D 84/834; H10D 84/0193; H10D 62/151; H10D 84/017; H01L 21/76855; H01L 21/76843; H01L 21/28518; H01L 23/485; H01L 21/76897; H01L 21/02636; H01L 21/28525;
(Continued)

(56) References Cited

U.S. PATENT DOCUMENTS 7,375,027 B2    5/2008   Tsai et al.
10,475,699 B2   11/2019  Hsieh et al.
(Continued)

FOREIGN PATENT DOCUMENTS

CN          111952367          11/2020

*Primary Examiner* — Mouloucoulaye Inoussa
(74) *Attorney, Agent, or Firm* — Winston Hsu

(57) ABSTRACT

The present disclosure relates to a semiconductor device and a fabricating method thereof, includes a substrate, a gate structure, a plug hole, a plug spacer, a metal silicide layer, and a plug. The gate structure is disposed on the substrate. The plug hole is disposed within a dielectric layer to partially extended into the substrate. The plug spacer is disposed on a sidewall of the plug hole to partially expose the substrate. The metal silicide layer is disposed at a bottom of the plug hole, wherein a portion of the substrate is sandwiched between the metal silicide layer and the plug spacer. The plug is disposed in the plug hole to physically contact the portion of the substrate. Accordingly, through forming the plug spacer to precisely define the forming location and the depth of the metal silicide layer, thereby achieving the function on improving the performance of the semiconductor device.

20 Claims, 5 Drawing Sheets

(51) Int. Cl.
    *H10D 62/10*      (2025.01)
    *H10W 20/00*     (2026.01)

(58) Field of Classification Search
    CPC ......... H01L 21/76814; H01L 21/02255; H01L
                 21/02236; H01L 21/31116; H01L
              21/0262; H01L 21/02532; H01L
             21/02576; H01L 21/02579; H01L
           21/76805; H01L 21/02238; H01L
                 2221/1063; B82Y 10/00
    See application file for complete search history.

(56)             References Cited

U.S. PATENT DOCUMENTS

| | | | |
|---|---|---|---|
| 10,486,157 | B2 | 11/2019 | Su et al. |
| 11,646,353 | B1 * | 5/2023 | Chen ..................... H10D 64/01 |
| | | | 257/233 |
| 2008/0079090 | A1 | 4/2008 | Hwang et al. |
| 2015/0035057 | A1 | 2/2015 | Jung |
| 2016/0308016 | A1 | 10/2016 | Choi |
| 2018/0308797 | A1 | 10/2018 | Tsai et al. |
| 2019/0273042 | A1 * | 9/2019 | Cheng .............. H01L 23/49811 |
| 2020/0035549 | A1 * | 1/2020 | Wu ................... H01L 21/76832 |
| 2020/0235214 | A1 * | 7/2020 | Huang ................ H10D 62/151 |
| 2021/0091078 | A1 * | 3/2021 | Lu ........................ H10D 84/038 |
| 2021/0184018 | A1 * | 6/2021 | Khaderbad ....... H01L 21/76831 |
| 2022/0020639 | A1 | 1/2022 | Liu et al. |
| 2022/0238665 | A1 | 7/2022 | Liu |
| 2022/0367353 | A1 * | 11/2022 | You .................. H01L 21/76831 |

* cited by examiner

SEMICONDUCTOR DEVICE AND METHOD OF FABRICATING THE SAME

BACKGROUND OF THE INVENTION

1. Field of the Invention

The present disclosure generally relates to a semiconductor device and a method of fabricating the same, and more particularly, to a semiconductor device having a plug structure, and a method of fabricating the same.

2. Description of the Prior Art

In the current fabricating process of metal-oxide-semiconductor transistor (MOS), a contact plug is necessary to electrically connect a gate and a source/drain of the transistor into a circuit. The contact plug generally includes a metal material such as tungsten, aluminum, copper or the like, the gate and the source/drain generally include a material like polysilicon material or single-crystal silicon material, and however, the electrical connection therebetween is not ideal. In order to improve the Ohmic contact between the contact plug, the gate and the source/drain, a metal silicide layer is additionally formed between the contact plug and the gate. However, the related process and design of the metal silicide layer are required to be further improved to effectively enhance the structural reliability and operational performance of related semiconductor devices.

SUMMARY OF THE INVENTION

One of the objectives of the present disclosure is to provide a semiconductor device and a method of fabricating the same, in which a plug spacer is additionally disposed at the sidewalls of the plug hole to precisely define the forming location and the forming depth of the metal silicide layer, thereby achieving the function on improving the performance of the semiconductor device.

To achieve the purpose described above, one embodiment of the present disclosure provides a semiconductor device including a substrate, a gate structure, a dielectric layer, a plug hole, a plug spacer, a metal silicide layer, and a plug. The gate structure is disposed on the substrate. The dielectric layer is disposed on the substrate to cover the gate structure. The plug hole is disposed within the dielectric layer to partially extended into the substrate. The plug spacer is disposed on a sidewall of the plug hole to partially expose the substrate. The metal silicide layer is disposed at a bottom of the plug hole, wherein a portion of the substrate is sandwiched between the metal silicide layer and the plug spacer. The plug is disposed in the plug hole to physically contact the portion of the substrate and the metal silicide layer.

To achieve the purpose described above, one embodiment of the present disclosure provides a fabricating method of a semiconductor device including the following steps. Firstly, a substrate is provided. The dielectric layer is formed on the substrate to cover the gate structure. The plug hole is formed within the dielectric layer to partially extend into the substrate. The plug spacer is formed on a sidewall of the plug hole, to partially expose the substrate. The metal silicide layer is formed at a bottom of the plug hole, wherein a portion of the substrate is sandwiched between the metal silicide layer and the plug spacer. The plug is formed in the plug hole to physically contact the portion of the substrate and the metal silicide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 2 to FIG. 7 are schematic diagrams illustrating a fabricating method of a semiconductor device according to the first embodiment in the present disclosure, in which:

FIG. 2 is a schematic cross-sectional view of a semiconductor device after forming a dielectric layer;

FIG. 3 is a schematic cross-sectional view of a semiconductor device after forming a plug hole;

FIG. 4 is a schematic cross-sectional view of a semiconductor device after a material layer;

FIG. 5 is a schematic cross-sectional view of a semiconductor device after performing an etching back process;

FIG. 6 is a schematic cross-sectional view of a semiconductor device after performing a metal silicidation process; and FIG. 7 is a schematic cross-sectional view of a semiconductor device after performing an etching process.

FIG. 9 to FIG. 10 are schematic diagrams illustrating a fabricating method of a semiconductor device according to another embodiment in the present disclosure, in which:

FIG. 9 is a schematic cross-sectional view of a semiconductor device after performing a metal silicidation process; and FIG. 10 is a schematic cross-sectional view of a semiconductor device after performing an etching process.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
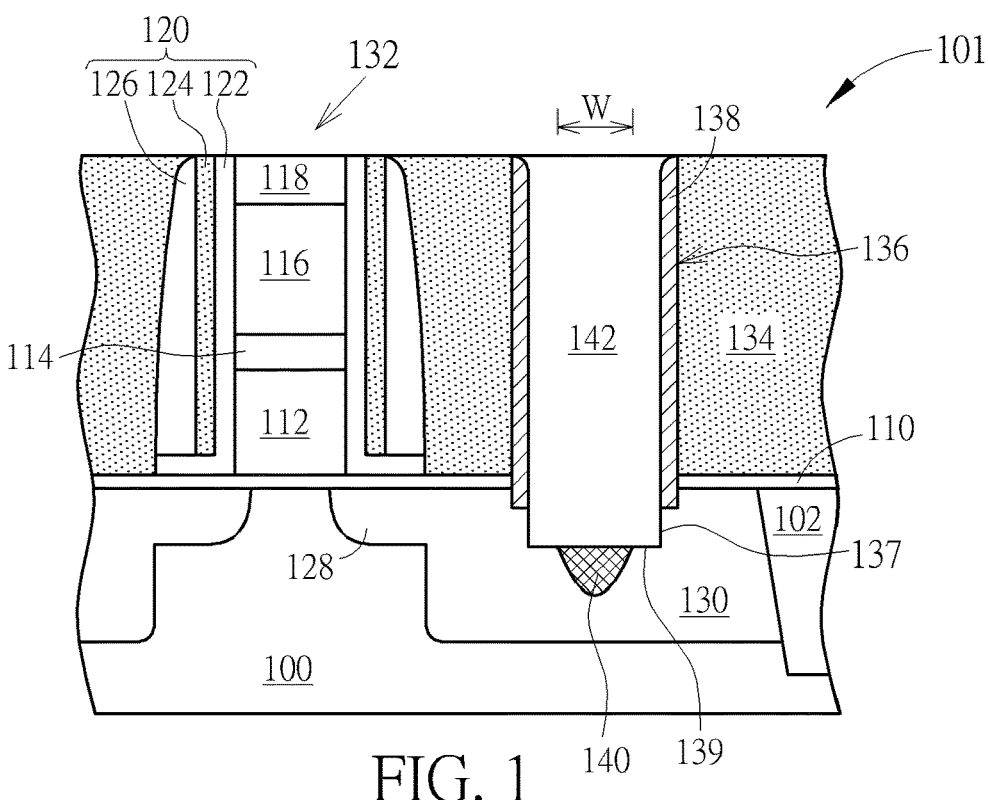
FIG. 1 is a schematic cross-sectional diagram illustrating a semiconductor device according to a first embodiment in the present disclosure.

Please refer to FIG. 1, illustrating a schematic diagram of a semiconductor device 101 according to the first embodiment in the present disclosure. As shown in FIG. 1, the semiconductor device 101 includes a substrate 100, a gate structure 132, a dielectric layer 134, a plug hole 136, a plug spacer 138, a metal silicide layer 140 and a plug 142. The substrate 100 for example includes a silicon substrate, a silicon-containing substrate, an epitaxial silicon substrate, a silicon-on-insulator (SOI) substrate or a substrate having other suitable material, but not limited thereto. The gate structure 132 is disposed on the substrate 100, and the dielectric layer 134 covers the gate structure 132, with a top surface of the dielectric layer 134 and a top surface of the gate structure 132 being substantially located at the same plane, but not limited thereto. The plug hole 136 penetrates through the dielectric layer 134 along a vertical direction (not shown in the drawings) being perpendicular to the top surface of the substrate 100, and the plug hole 136 further extends into the substrate 100, to expose a portion of the substrate 100 from a bottom sidewall 137 and a bottom surface 139 of the plug hole 136. The plug 142 is disposed in the plug hole 136 to electrically connect a doped region 130 disposed within the substrate 100. It is noted that, the plug spacer 138 is disposed on a sidewall of the plug hole 136, to define the location of the metal silicide layer 140 at the bottom of the plug hole 136, and a portion of the doped region 130 within the substrate 100 is sandwiched between the metal silicide layer 140 and the plug spacer 138, to physically contact the plug 142. In other words, a sidewall of the plug 142 along the vertical direction physically contacts the portion of the doped region 130 and the plug spacer 138 at the same time, and a bottom surface of the plug 142 physically contacts the portion of the doped region 130 within the substrate 100 and the metal silicide layer 140 at the same time. Accordingly, through setting the plug spacer 138 to precisely define the forming location and the forming depth of the metal silicide layer 140, the sidewall of the plug 142 will be aligned with a sidewall of the metal silicide layer 140. Furthermore, the plug 142 enables to directly contact the metal silicide layer 140 and partial substrate 100 (namely the doped region 130) at the same time, so as to provide optimized ohmic contact, and to generate a relatively larger lateral contact resistance at the bottom sidewall and the bottom surface of the plug 142. Then, the electrical performance of the semiconductor device 101 will be dramatically improved thereby.

The metal silicide layer 140 for example includes a metal silicide material like cobalt silicide ($CoSi_x$), titanium silicide ($TiSi_2$) or nickel silicide ($Ni_2Si$), and preferably includes cobalt disilicide ($CoSi_2$), but is not limited thereto. The plug spacer 138 for example includes a dielectric material like silicon oxide, silicon nitride, silicon oxynitride (SiON) or silicon carbonitride (SiCN), or a conductive barrier material like titanium or tantalum, but not limited thereto. Since the plug spacer 138 disposed on the sidewall of the plug hole 136 restricts the lateral extension of the metal silicide layer 140, the metal silicide layer 140 is precisely defined to be located at the bottom of the plug hole 136, and also, an extension area of the metal silicide layer 140 in a horizontal direction (not shown in the drawings) parallel to the top surface of the substrate 100 gradually decreases with an increasing depth of the metal silicide layer 140 within the substrate 100, thereby having an inverted triangular cross-section. In other words, the cross-section of the metal silicide layer 140 has a maximum width "W" at a topmost surface thereof, and the width of the metal silicide layer 140 gradually decreases downwardly, as shown in FIG. 1. In one embodiment, the topmost surface of the metal silicide layer 140 is lower than the top surface of the substrate 100, without physically contacting the plug spacer 138.

Precisely speaking, the gate structure 132 for example includes a polysilicon gate structure, a metal gate structure or a gate structure which is integrally formed by a memory device fabrication. The gate structure 132 includes a stacked structure, and a gate spacer 120 disposed on a sidewall of the stacked structure. The stacked structure includes a semiconductor layer 112, a barrier layer 114, a conductive layer 116, and a capping layer 118 stacked from bottom to top. In one embodiment, the semiconductor layer 112 for example includes a semiconductor material like doped polysilicon or doped amorphous silicon, the barrier layer 114 for example includes a conductive barrier material like titanium and/or titanium nitride, tantalum and/or tantalum nitride, the conductive layer 116 for example includes a low-resistance conductive material like copper, aluminum or tungsten, and the capping layer 118 for example includes an insulating material like silicon oxide, silicon nitride or silicon oxynitride, but not limited thereto. The gate spacer 120 is disposed between the stacked structure and the dielectric layer 134, at one side of the plug spacer 138. The gate spacer 120 for example includes a multilayer structure, for example including a first spacer 122, a second spacer 124 and a third spacer 126 sequentially disposed on the sidewall of the stacked structure along the horizontal direction. In one embodiment, the first spacer 122 and the third spacer 126 for example include the same insulating material like silicon nitride, silicon carbonitride, and the second spacer 124 includes an insulating material which is different from that of the first spacer 122 and the third spacer 126, such as being silicon oxide or silicon oxynitride, but is not limited thereto. In another embodiment, the gate spacer may also include a monolayer structure, for example only including an insulating material like silicon oxide, silicon nitride, or silicon oxynitride, but not limited thereto.

The semiconductor device 101 further includes a shallow trench isolation 102 disposed in the substrate 100, an insulating layer 110 disposed on the substrate 100, and a lightly doped source/drain region 128 disposed within the substrate 100. In the present embodiment, a top surface of the shallow trench isolation 102 is coplanar with the top surface of the substrate 100, to surround and to define a plurality of active areas (not shown in the drawings) within the substrate 100. The formation of the shallow trench isolation 102 is for example accomplished through a patterning process of the substrate 100, which includes but is not limited to the following steps. Firstly, a mask layer (not shown in the drawings) is formed on a bulk silicon substrate (not shown in the drawings), to form at least one trench (not shown in the drawings), and a deposition process is next performed to form an insulating material in the trench, to serve as the shallow trench isolation 102. In another embodiment, the top surface of the shallow trench isolation 102 may also be not coplanar with the top surface of the substrate 100, to surround a portion of the substrate 100 which is protruded from the top surface of the shallow trench isolation 102, with the portion of the substrate 100 being defined as fins. The insulating layer 110 entirely covers the top surface of the substrate 100, and between the gate structure 132 and the substrate 100, to function as a gate dielectric layer of the gate structure 132 and to isolate other components disposed on the substrate 100 or disposed within the substrate 100. In one embodiment, the insulating layer 110 for example includes a nitride dielectric material (such as silicon nitride), an oxide dielectric material (such as silicon oxide), a high dielectric constant dielectric material (such as a dielectric material having a dielectric constant higher than 3.9 or higher than 4.52) or other suitable dielectric materials, or a composite layer structure of a nitride dielectric material and an oxide dielectric material, such as an oxide-nitride-silicon oxide structure, but not limited thereto.

On the other hand, two lightly doped source/drain regions 128 and two doped regions 130 are both disposed within the substrate 100, at two opposite sides of the gate structure 132. The lightly doped source/drain regions 128 and the doped regions 130 for example include the same conductive type and the same dopant, within a doping concentration of the dopant in the lightly doped source/drain regions 128 being smaller than that in the doped regions 130. For example, if the gate structure 132 is prepared to form a P-type MOS transistor (PMOS) in the subsequent process, the lightly doped source/drain regions 128 and the doped region 130s include for example a P-type dopant such as boron, and if the gate structure 132 is prepared to form an N-type MOS transistor (NMOS) in the subsequent process, the lightly doped source/drain regions 128 and the doped regions 130 include an N-type dopant such as phosphorus, but not limited thereto.

With these arrangements, the plug 142 disposed in the dielectric layer 134 is electrically connected to a source/drain (namely the doped region 130) of the gate structure 132 through the metal silicide layer 140 at the bottom of the plug hole 136, with the topmost surface of the metal silicide layer 140 having the maximum width "W" to provide the optimal ohmic contact, and with the gradually decreasing extension area of the metal silicide layer 140 (having an inverted triangular cross-section) gradually enlarging the distance spaced apart from peripheral components, to avoid the short circuit issue.

On the other hands, since the metal silicide layer 142 is not disposed on the bottom sidewall and the bottom surface of the plug 142, the bottom sidewall and the bottom surface of the plug 142 will directly contact the source/drain (namely the doped regions 130) to generate a relatively larger sheet resistance in the lateral contact. In this way, the currents generated in the semiconductor device 101 are guided in a specific direction (downward) in a more sufficient manner. Thus, the semiconductor device 101 of the present embodiment enables to gain a reliable structure and an optimized performance, and which can be further electrically connected to other active components and/or passive components through other downward and/or upward connecting components in the subsequent process, to achieve better operation.

In order to make people skilled in the art of the present disclosure easily understand the semiconductor device of the present disclosure, the fabricating method of the semiconductor device in the present disclosure will be further described below.

Figure 2:
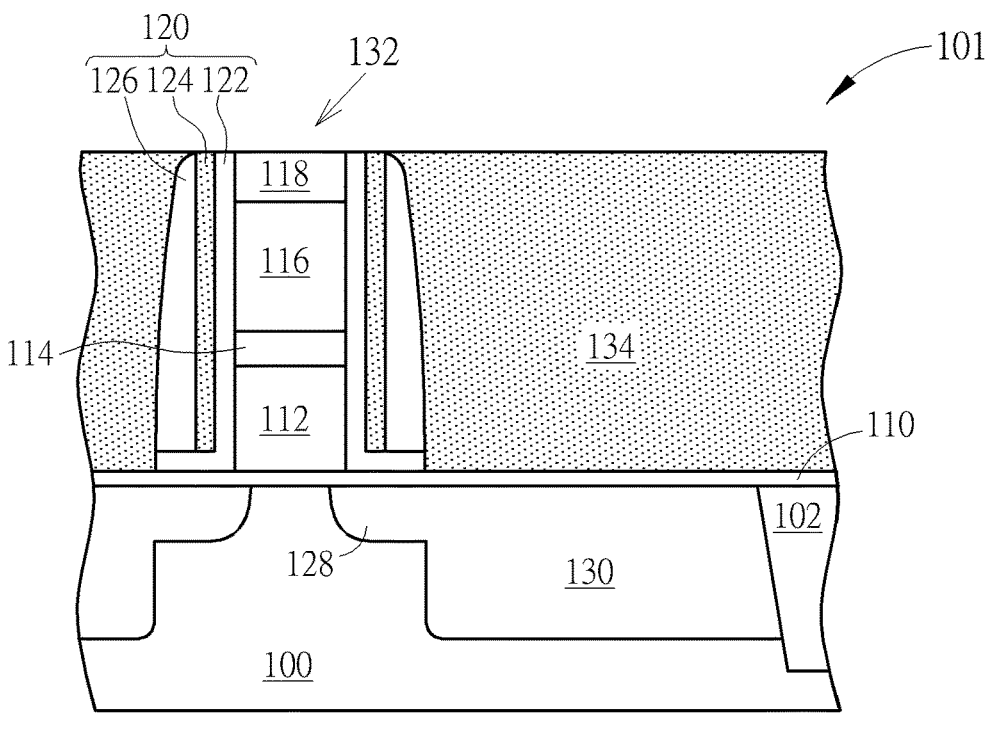
Figure 7:
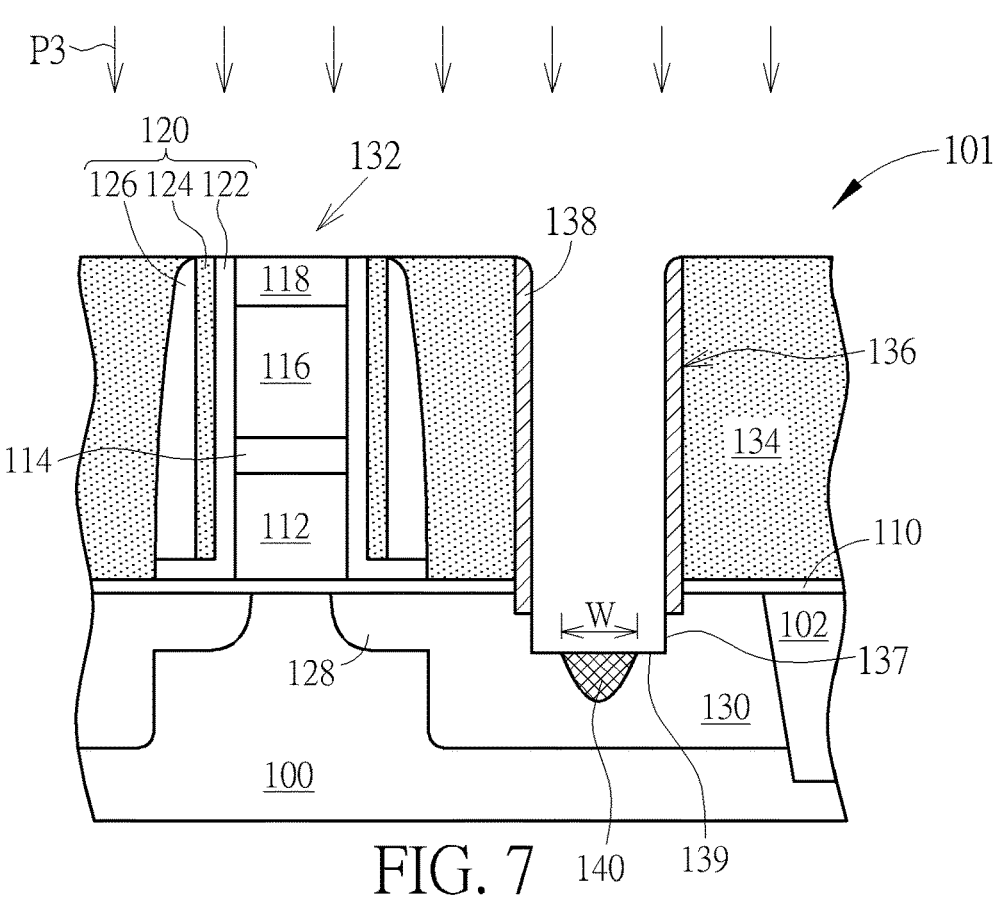

Please refer to FIG. 2 and FIG. 7, illustrating schematic diagrams of a fabricating method of the semiconductor device 101 according to one embodiment in the present disclosure. Firstly, as shown in FIG. 2, the gate structure 132 is formed on the insulating layer 110, and the lightly doped source/drain regions 128 and the doped regions 130 are formed in the substrate 100, at two opposite sides of the gate structure 132. The formation of the gate structure 132 may be integrated into a fabrication of a memory device such as a DRAM device, for example, forming the gate structure 132 while fabricating a bit line (not shown in the drawings), but is not limited thereto. In another embodiment, the gate structure may also be formed through a general gate process, for example being formed through a gate-last process and a high-k last process. In one embodiment, the lightly doped source/drain regions 128 are formed after forming the stacked structure of the gate structure 132, by using the stacked structure as a mask for ion-implantation. Accordingly, a sidewall of the lightly doped source/drain region 128 is vertically aligned with the sidewall of the stacked structure in the vertical direction, but not limited thereto. Also, the doped regions 130 are formed after forming the gate spacer 120, by using the gate spacer 120 as a mask for ion-implantation, so that, a sidewall of the doped region 130 is vertically aligned with a sidewall of the gate spacer 120 in the vertical direction, but not limited thereto.

Next, further in view of FIG. 2, the dielectric layer 134 is formed on the substrate 100, to cover the gate structure 132. The formation of the dielectric layer 134 is for example accomplished by sequentially performing a deposition process and an etching back process of a dielectric material, to form the dielectric layer 134 having the top surface being coplanar with the top surface of the gate structure 132. In one embodiment, the dielectric material includes a nitride dielectric material (such as silicon nitride), an oxide dielectric material (such as silicon oxide) or other suitable dielectric materials, and preferably includes a dielectric material being the same as that of the second spacer 124, like silicon oxide, silicon oxynitride, but not limited thereto.

Figure 3:
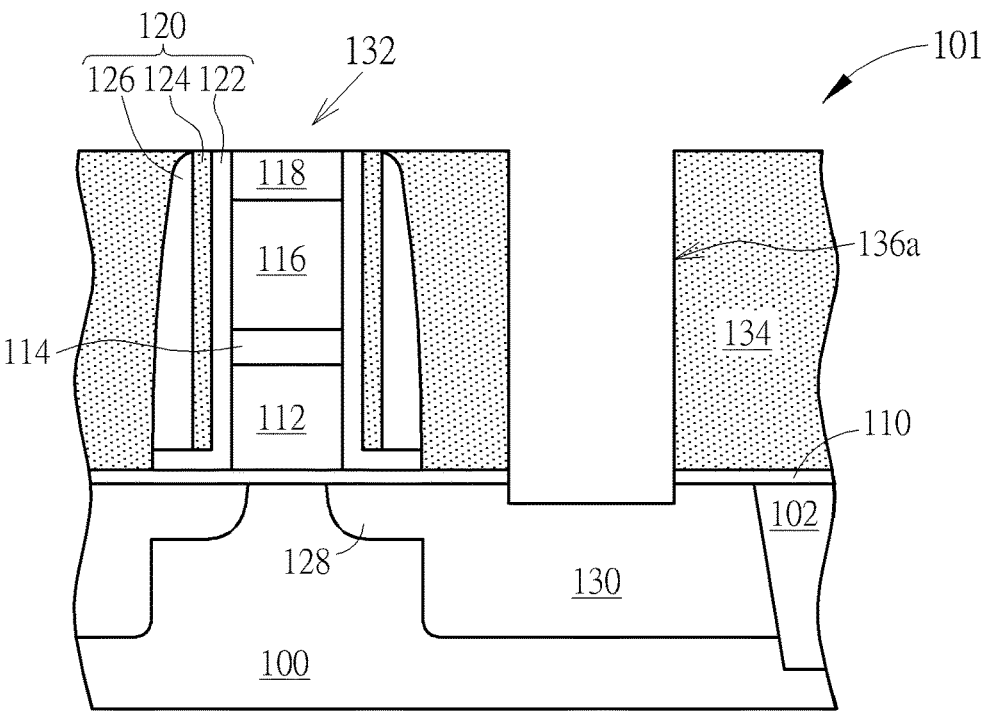

As shown in FIG. 3, a through hole 136a is formed in the dielectric layer 134. The through hole 136a penetrates through the dielectric layer 134 and the insulating layer 110 in the vertical direction, to partially extend into the substrate 100. The bottom surface of the through hole 136a is lower than the top surface of the substrate 100, to expose a portion of the doped region 130.

Figure 4:
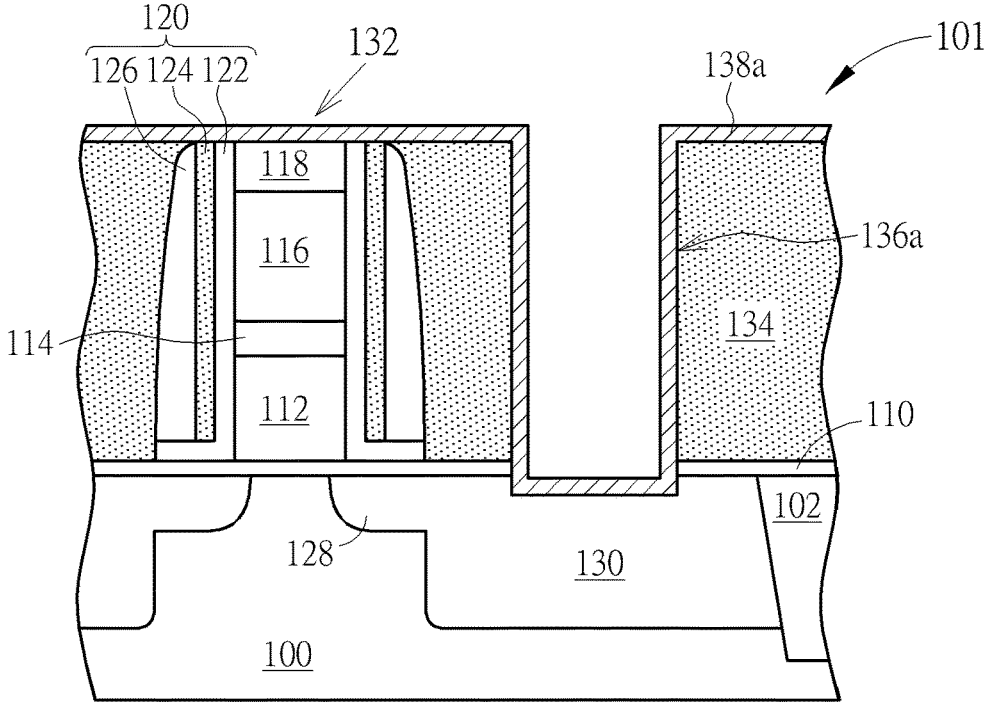

As shown in FIG. 4, a material layer 138a is formed, to comformally cover the top surface of the dielectric layer 134 and the bottom surface and a sidewall of the through hole 136a. In other words, the material layer 138a is partially formed within the through hole 136a and partially formed outside the through hole 136a. In one embodiment, the material layer 138a for example includes a dielectric material like silicon oxide, silicon nitride, silicon oxynitride or silicon carbonitride, or a high dielectric constant dielectric material, and preferably includes a dielectric material having an etching selectivity related to the dielectric layer 134 and the spacer 120, but not limited thereto. In other embodiments, the material layer 138a may also include a conductive barrier material like titanium or tantalum, but not limited thereto. The formation of the material layer 138a is carried out through a film forming process such as a chemical vapor deposition process, a physical vapor deposition process or other suitable processes, but not limited thereto. In another embodiment, the material layer 138a may optionally include a monolayer structure or a multilayer structure based on practical product requirements.

Figure 5:
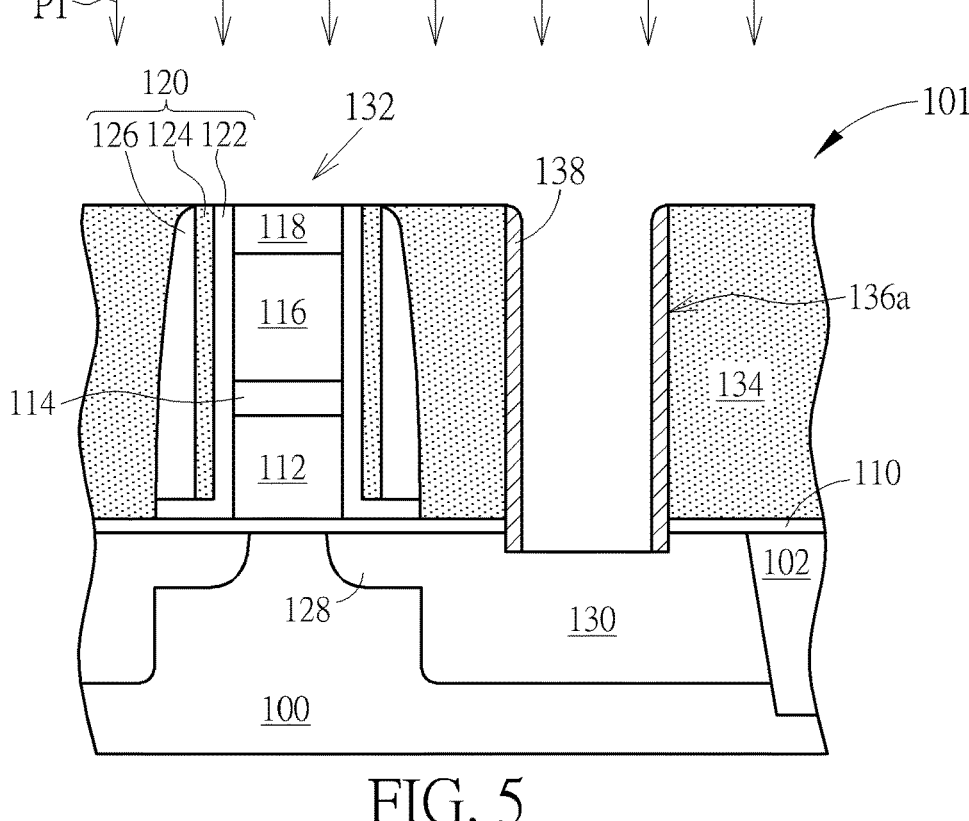

As shown in FIG. 5, an etching back process P1 is performed, to remove the material layer 138a outside the through hole 136a and the material layer 138a disposed on the bottom surface of the through hole 136a, to form the plug spacer 138 only disposed on the sidewall of the through hole 136a. Furthermore, after performing the etching back process P1, a portion of the doped region 130 is exposed again from the bottom surface of the through hole 136a.

Figure 6:
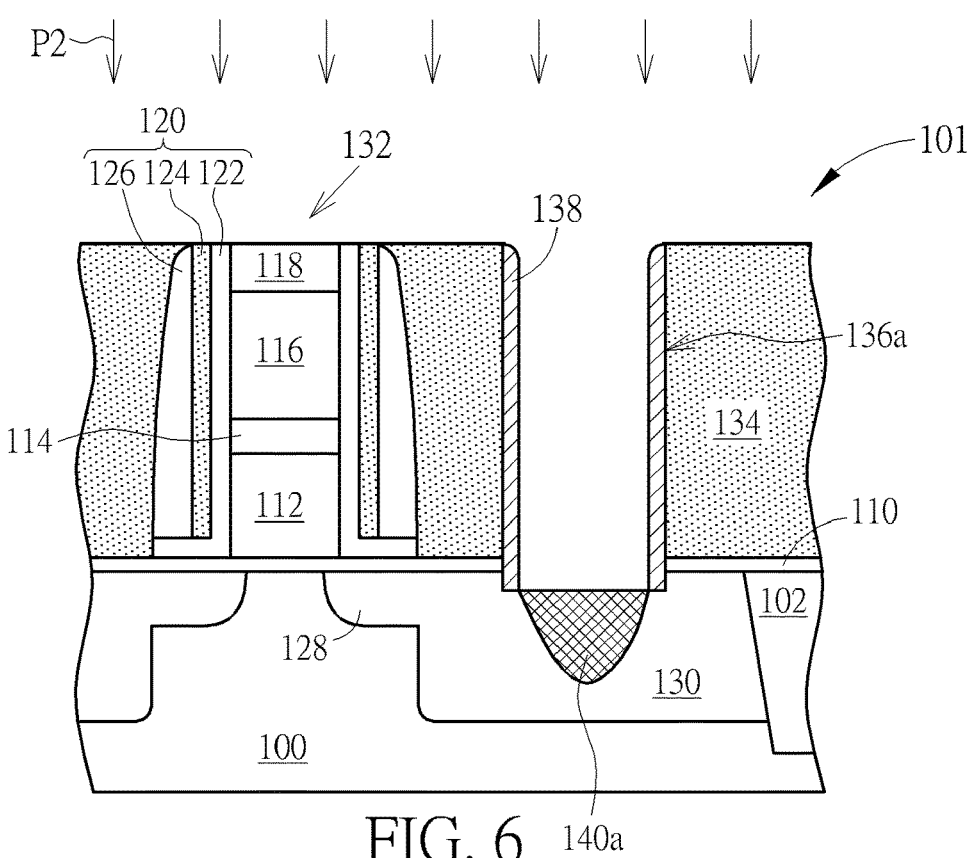

As shown in FIG. 6, a metal silicidation process P2 is performed, to form a metal silicide material layer 140a at the bottom of the through hole 136a. The metal silicidation process P2 includes but is not limited to the following steps. Firstly, a selectively deposition process is performed, for example using a selective epitaxial growth process or selective introducing a metal plasma at the bottom of the through hole 136a, to form a metal layer (not shown in the drawings) only disposed at the bottom of the through hole 136a, wherein the metal layer for example includes a metal material like cobalt, titanium or nickel being suitable for reacting with a silicon material, and preferably includes cobalt. Then, a thermal treatment process is performed, and the metal layer reacts with the exposed portion of the doped region 130 (namely the substrate 100) to transform into a metal silicide material layer 140*a*. In one embodiment, the metal silicide material layer 140*a* for example includes a metal silicide material like cobalt silicide, titanium silicide and nickel silicide, and preferably includes cobalt disilicide, but is not limited thereto.

Precisely speaking, since the plug spacer 138 disposed on the sidewall of the through hole 136*a* defines the forming area of the metal layer, the metal layer is accurately formed at the bottom of the through hole 136*a*. With these arrangements, the metal layer will be completely reacted thereto and is transformed into the metal silicide material layer 140*a* during the thermal treatment process, to omit the following step of removing the unreacted metal layer. On the other hand, the reacting area of the thermal treatment process is correspondingly restricted by the plug spacer 138, to form the metal silicide material layer 140*a* having an extension area in the horizontal direction which gradually decreases by the increasing depth of the metal silicide material layer 140*a* within the substrate 100. That is, the extension area of the topmost surface of the metal silicide material layer 140*a* does not exceed an extension area of the aperture of the through hole 136*a*, and also, the metal silicide material layer 140*a* includes an inverted triangular cross-sectional structure because the lateral reaction of the metal silicide material layer 140*a* is limited by the plug spacer 138.

Then, as shown in FIG. 7, an etching process P3 such as a dry etching process is performed, to vertically remove a portion of the metal silicide material layer 140*a*, and to reduce the extension area of the metal silicide material layer 140*a* in the horizontal direction in an overall manner, thereby forming the metal silicide layer 140. The metal silicide layer 140 includes an inverted triangular cross-section, with the width thereof being maximized at the topmost surface (having the maximum width "W") and gradually shrunk downwardly. Meanwhile, after removing the portion of the metal silicide material layer 140*a*, a portion of the doped region 130 (substrate) is exposed again to form the plug hole 136, exposing both the bottom sidewall 137 and the bottom surface 139 of the plug hole 136. The extension area of the aperture of the plug hole 136 is obviously greater than the maximum width "W" of the metal silicide layer 140, so that the metal silicide layer 140 is just below the center of the plug hole 136, to expose the topmost surface of the metal silicide layer 140 with the maximum width "W", as shown in FIG. 7. It is noted that, the plug hole 136 has an overall vertical sidewall, and an upper portion of the plug hole 136 completely overlaps the through hole 136*a* as shown in FIG. 6.

After that, the plug 142 is continuously formed in the plug hole 136, thereby forming the semiconductor device 101 as shown in FIG. 1. In one embodiment, the plug 142 for example includes a barrier layer (not shown in the drawings) which is conformally formed on the sidewall and the bottom surface of the plug hole 136, and a contact metal layer (not shown in the drawings) which is filled in the plug hole 136, but not limited thereto. In the present embodiment, the semiconductor device 101 is allowable to precisely define the forming location and the forming depth of the metal silicide layer 140 through disposing the plug spacer 138, so that, the vertical sidewall of the plug 142 formed in the subsequent process will simultaneously contact the plug spacer 138 and the doped region 130 (namely the substrate 100), and the bottom surface of the plug 142 will simultaneously contact the metal silicide layer 140 and the doped region 130, thereby improving the structural reliability and the performance of the semiconductor device 101. Through the above processes, the fabrication of semiconductor device 101 in the present embodiment is accomplished. The semiconductor device 101 formed accordingly will therefore obtain a reliable structure and an optimize performance, and which can be further electrically connected to other active components and/or passive components through other downward and/or upward connecting components in the subsequent process, to achieve better operation.

People in the art should fully realize that the semiconductor device and the fabricating method thereof are not limited to the aforementioned embodiment and may include other examples or may be achieved through other strategies to meet practical product requirements. The following description will detail the different embodiments of the semiconductor device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
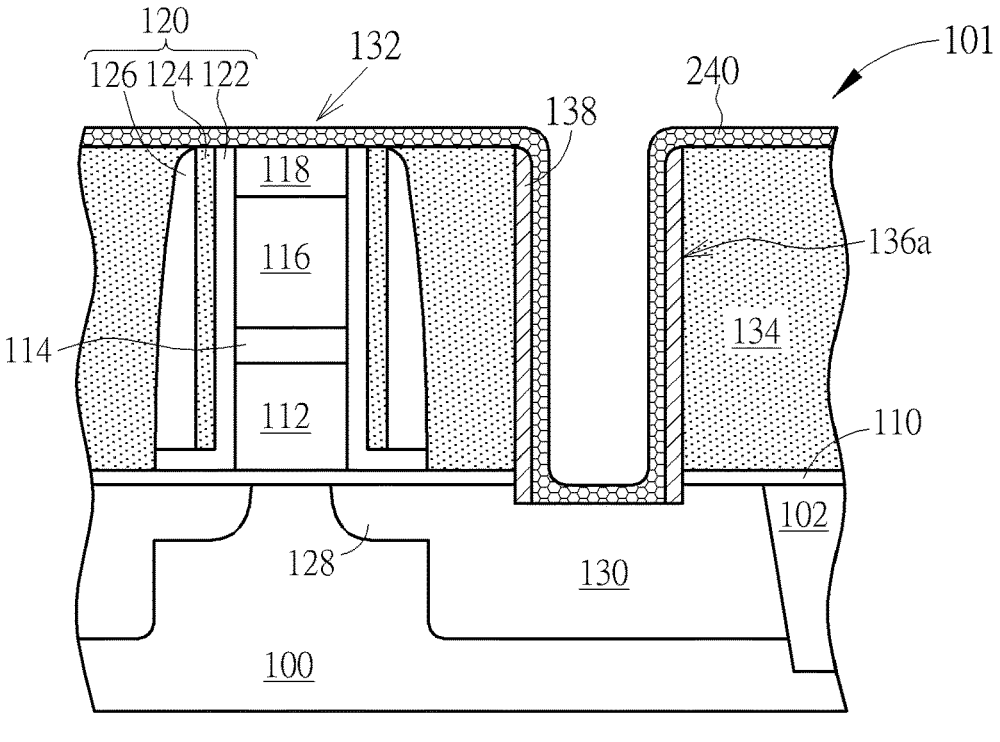
FIG. 8 is a schematic diagram illustrating a fabricating method of a semiconductor device according to another embodiment in the present disclosure.

Please refer to FIG. 8, illustrating a schematic diagram of a fabricating method of a semiconductor device according to the second embodiment in the present disclosure. The forming processes of the present embodiment are substantially the same as the forming processes of the aforementioned embodiment, and the difference therebetween is mainly in that a metal silicidation process of the present embodiment includes forming a metal layer 240 through a deposition process or a sputtering process, and a thermal treatment process.

Precisely speaking, after forming the structure as shown in FIG. 5, the metal layer 240 is formed by performing the deposition process or the sputtering process. The metal layer 240 is conformally formed on the top surface of the dielectric layer 134 and the bottom surface and the sidewall of the through hole 136*a*, to cover the plug spacer 138. Accordingly, the metal layer 240 is partially formed inside the through hole 136*a* and is partially formed outside the through hole 136*a*. In one embodiment, the metal layer 240 for example includes a metal material like cobalt, titanium, or nickel being suitable for reacting with a silicon material, and preferably includes cobalt, but not limited thereto. Then, a barrier layer (not shown in the drawings) is optionally formed on the metal layer 240 in a conformal manner, with the barrier layer for example including a conductive barrier material like titanium and/or titanium nitride, tantalum and/or tantalum nitride, and the thermal treatment process is next performed. The barrier layer enables to prevent the metal material from diffusing into the surrounding components during the thermal treatment process, and the metal layer 240 will be uniformly heated, and reacted thereto at the same time to form the metal silicide material layer 140*a* as shown in FIG. 6.

After that, another etching process is additionally performed to remove the barrier layer and an unreacted portion of the metal layer 240, and the etching process as shown in FIG. 7 is next performed, to form the plug hole 136 as shown in FIG. 7, and the plug 142 as shown in FIG. 1 is continuously formed in the plug hole 136, to form the semiconductor device 101 as shown in FIG. 1 thereby. Through the above processes, the fabrication of semiconductor device 101 in the present embodiment is accomplished. With these performances, the semiconductor device 101 formed accordingly also obtains a reliable structure and an optimize performance, and which can be further electrically connected to other active components and/or passive components through other downward and/or upward connecting components in the subsequent process, to achieve better operation.

Figures 9, 10:
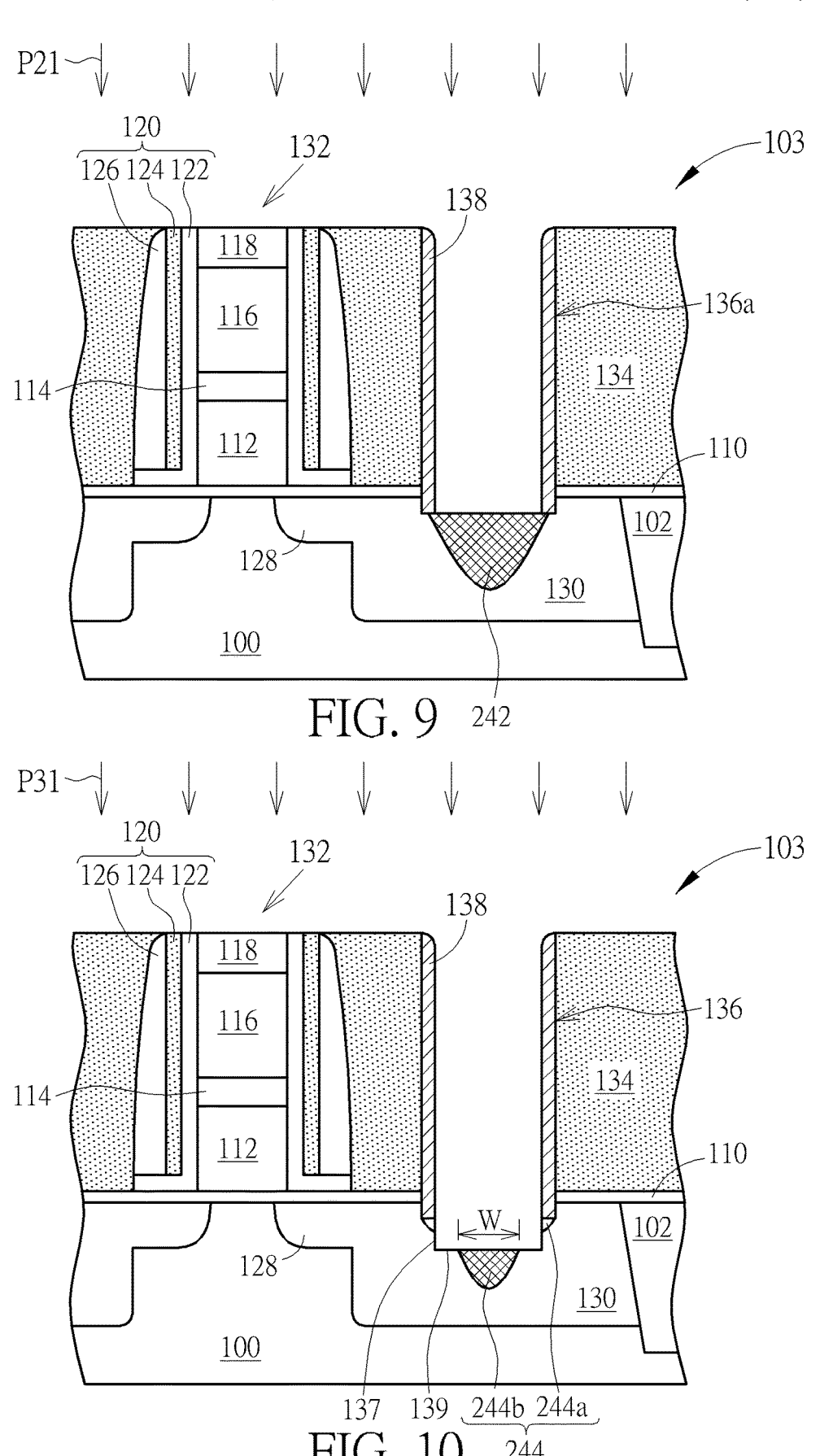

Please refer to FIG. 9 to FIG. 10, illustrating a schematic diagram of a fabricating method of a semiconductor device 103 according to another embodiment in the present disclosure. The forming processes of the present embodiment are substantially the same as the forming processes of the aforementioned embodiments, and the difference therebetween is mainly in that a metal silicidation process P21 of the present embodiment is performed by controlling the parameters or the conditions of the selective epitaxial growth process or selectively introducing metal plasma, to make a topmost surface of the metal silicide material layer 242 extending beyond the extending area of the aperture of the through hole 136a.

Precisely speaking, as shown in FIG. 9, while performing the selective epitaxial growth process or selectively introducing the metal plasma, a process time, a process temperature, or a flow rate or a proportion of the metal plasma are synchronously adjusted, so that the metal silicide material layer 242 formed accordingly also includes an inverted triangular cross-sectional structure. Two opposite sides of the cross-sectional structure of the metal silicide material layer 242 are located between an inner sidewall and an outer sidewall of the plug spacer 138 in a direction being perpendicular to the substrate 100, as shown in FIG. 9, but not limited thereto. Alternatively, in another embodiment, the two opposite sides of the cross-sectional structure of a metal silicide material layer (not shown in the drawings) may be located between the outer sidewall of the plug spacer 138 and an outer sidewall of the gate spacer 120 by adjusting the process time, the process temperature, or the flow rate of the proportion of the introduced metal plasma based on practical product requirements.

After that, an etching process P31 such as a dry etching process as shown in FIG. 10 is performed to vertically remove a portion of the metal silicide material layer 242, and to reduce the extension area of the metal silicide material layer 242 along the horizontal direction in an overall manner, thereby forming a metal silicide layer 244. Meanwhile, after removing the portion of the metal silicide material layer 242, a portion of the doped region 130 (substrate) is exposed again to form the plug hole 136 exposing both the bottom sidewall 137 and the bottom surface 139 therefrom. It is noted that, since the extension area of the topmost surface of the metal silicide material layer 242 as shown in FIG. 9 exceeds the extension area of the aperture of the through hole 136a, the metal silicide material layer 242 will be cut into two portions during vertically etching the metal silicide material layer 242. Then the metal silicide layer 244 will therefore obtain a discontinuous structure, wherein a first portion 244a of the metal silicide layer 244 is formed directly below the plug spacer 138, to physically contact the bottom surface of the plug spacer 138 and the bottom sidewall 137 of the plug hole 136, and a second portion 244b of the metal silicide layer 244 includes an inverted triangular cross-section and is located directly below the center of the plug hole 136. It is also noted that, the width of the second portion 244b is also maximized at the topmost surface (having the maximum width "W") thereof and is gradually shrunk downwardly, and the topmost surface of the second portion 244b is also exposed from the plug hole 136, as shown in FIG. 10.

Following these, the plug 142 as shown in FIG. 1 is continuously formed in the plug hole 136. In the present embodiment, the metal silicide layer 244 has the discontinuous structure, with the first portion 244a being disposed right below the center of the plug spacer 136, and with the second portion 244b having an inverted cross-section right below the center of the plug hole 136, to provide an optimized ohmic contact. Through the above processes, the fabrication of semiconductor device 103 in the present embodiment is accomplished. With these performances, the semiconductor device 103 formed accordingly also obtains a reliable structure and an optimize performance, and which can be further electrically connected to other active components and/or passive components downward and/or upward through other connecting components in the subsequent process, to achieve better operation.

Overall speaking, according to the semiconductor device and the fabricating method thereof, the plug spacer is additionally disposed at the sidewall of the plug hole, to precisely define the forming location and the forming depth of the metal silicide layer, and to achieve the function on improving the performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a gate structure, disposed on the substrate;
   a dielectric layer, disposed on the substrate to cover the gate structure;
   a plug hole, disposed within the dielectric layer to partially extend into the substrate;
   a plug spacer, disposed on a sidewall of the plug hole to partially expose the substrate;
   a metal silicide layer, disposed at a bottom of the plug hole, wherein the metal silicide layer comprises two portions separately disposed from each other; and
   a plug, disposed in the plug hole to physically contact the portion of the substrate, wherein the two portions of the metal silicide layer respectively contact a side surface and a bottom surface of the plug.

2. The semiconductor device according to claim 1, wherein a sidewall of the metal silicide layer is vertically aligned with a sidewall of the plug spacer.

3. The semiconductor device according to claim 1, wherein an extension area of the metal silicide layer in a horizontal direction gradually decreases with an increasing depth of the metal silicide layer.

4. The semiconductor device according to claim 1, wherein the plug spacer is separated from the metal silicide layer.

5. The semiconductor device according to claim 1, wherein a vertical sidewall of the plug physically contacts the portion of the substrate and the plug spacer at the same time.

6. The semiconductor device according to claim 1, wherein the gate structure further comprising:
   a stacked structure; and
   a gate spacer, disposed on a sidewall of the stacked structure, at one side of the plug spacer.

7. The semiconductor device according to claim 1, further comprising:

two doped regions, disposed in the substrate and at two opposite sides of the gate structure, wherein the plug physically contacts the doped regions.

8. A fabricating method of a semiconductor device, comprising:

providing a substrate;

forming a gate structure on the substrate;

forming a dielectric layer on the substrate, to cover the gate structure;

forming a plug hole within the dielectric layer, to partially extend into the substrate;

forming a plug spacer on a sidewall of the plug hole, to partially expose the substrate;

forming a metal silicide layer at a bottom of the plug hole, wherein the metal silicide layer comprises two portions separately disposed from each other; and forming a plug in the plug hole, to physically contact the portion of the substrate, wherein the two portions of the metal silicide layer respectively contact a side surface and a bottom surface of the plug.

9. The fabricating method of the semiconductor device according to claim 8, wherein forming the metal silicide layer further comprises:

forming two doped regions in the substrate, at two opposite sides of the gate structure; and forming a through hole in the dielectric layer, to partially expose the doped regions.

10. The fabricating method of the semiconductor device according to claim 9, further comprising:

performing a metal silicidation process to form a metal silicide material layer.

11. The fabricating method of the semiconductor device according to claim 10, wherein the metal silicidation process further comprises:

performing a selectively epitaxial growth process, to form a metal layer in the through hole; and transforming the metal layer into the metal silicide material layer.

12. The fabricating method of the semiconductor device according to claim 10, further comprising:

performing a deposition process, to form a metal layer;

transforming the metal layer into the metal silicide-silicon material layer; and after forming the metal silicide material layer, removing an unreacted portion of the metal layer.

13. The fabricating method of the semiconductor device according to claim 10, further comprising:

after performing the metal silicidation process, partially removing the metal silicide material layer, to form the plug hole and the metal silicide layer disposed at the bottom of the plug hole, wherein an upper portion of the plug hole overlaps the through hole.

14. The fabricating method of the semiconductor device according to claim 13, further comprising:

before performing the metal silicidation process, depositing a material layer in the through hole; and partially removing the material layer, to form the plug spacer at a sidewall of the through hole.

15. The fabricating method of the semiconductor device according to claim 8, wherein an extension area of the metal silicide layer in a horizontal direction gradually decreases with an increasing depth of the metal silicide layer.

16. The fabricating method of the semiconductor device according to claim 8, wherein a sidewall of the metal silicide layer is vertically aligned with a sidewall of the plug spacer.

17. A semiconductor device, comprising:

a substrate;

a gate structure, disposed on the substrate;

a dielectric layer, disposed on the substrate to cover the gate structure;

a plug hole, disposed within the dielectric layer to partially extend into the substrate;

a plug spacer, disposed on a sidewall of the plug hole to partially expose the substrate;

a metal silicide layer, disposed at a bottom of the plug hole, wherein the metal silicide layer comprises a discontinuous structure and a portion of the substrate is sandwiched between the metal silicide layer and the plug spacer; and a plug, disposed in the plug hole to physically contact the portion of the substrate.

18. The semiconductor device according to claim 17, wherein a sidewall of the metal silicide layer is vertically aligned with a sidewall of the plug spacer.

19. The semiconductor device according to claim 17, wherein an extension area of the metal silicide layer in a horizontal direction gradually decreases with an increasing depth of the metal silicide layer.

20. The semiconductor device according to claim 17, wherein the plug spacer is separated from the metal silicide layer.

* * * * *